US012646447B2

(12) United States Patent
Takahashi

(10) Patent No.: US 12,646,447 B2
(45) Date of Patent: Jun. 2, 2026

(54) LIGHT-EMITTING ELEMENT DRIVE SYSTEM AND LIGHT-EMITTING ELEMENT DRIVE DEVICE

(71) Applicant: ROHM CO., LTD., Kyoto (JP)

(72) Inventor: Toru Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/962,801

(22) Filed: Nov. 27, 2024

(65) Prior Publication Data

US 2025/0095559 A1     Mar. 20, 2025

Related U.S. Application Data

(63) Continuation of application No. PCT/JP2023/016672, filed on Apr. 27, 2023.

(30) Foreign Application Priority Data

Jun. 8, 2022     (JP) ................................. 2022-092745

(51) Int. Cl.
*G09G 3/32* (2016.01)
*H10W 90/00* (2026.01)

(52) U.S. Cl.
CPC ....... *G09G 3/32* (2013.01); *G09G 2310/0291* (2013.01); *G09G 2310/08* (2013.01); *G09G 2320/064* (2013.01); *H10W 90/00* (2026.01)

(58) Field of Classification Search
CPC ......... G09G 2320/064; G09G 2310/08; G09G 2310/0291; G09G 3/32; H01L 25/167;
(Continued)

(56) References Cited

U.S. PATENT DOCUMENTS 9,429,965 B2 *    8/2016    D'Angelo ............... G05F 1/461
11,178,742 B1 *  11/2021    Bassi ................... G09G 3/3426
(Continued)

FOREIGN PATENT DOCUMENTS

JP        2010040641 A      2/2010
JP        2013021117 A      1/2013

OTHER PUBLICATIONS

International Search Report and Written Opinion in International Appln. No. PCT/JP2023/016672, mailed on Jun. 20, 2023, 16 pages (with machine translation).

*Primary Examiner* — Muhammad N Edun
(74) *Attorney, Agent, or Firm* — Fish & Richardson P.C.

(57) ABSTRACT

Provided is a light-emitting element drive system including a leader light-emitting element drive device configured to be capable of driving light-emitting elements, and to include a DC/DC controller configured to be capable of controlling an output stage that can output an output voltage; and a plurality of follower light-emitting element drive devices configured to be capable of driving the light-emitting elements applied with the output voltage. The follower light-emitting element drive device includes at least one signal output terminal capable of outputting an operation information signal related to driving of the light-emitting elements. A plurality of the signal output terminals are connected to the same node, and the same node is connected to a signal input terminal of the leader light-emitting element drive device.

8 Claims, 11 Drawing Sheets

(58) Field of Classification Search
CPC .. H05B 45/325; H05B 47/105; H05B 45/375;
H05B 45/345; H05B 47/14; H05B 45/38;
H05B 47/16; H02M 3/155; H10H 20/80
See application file for complete search history.

(56)                              References Cited

U.S. PATENT DOCUMENTS

2009/0187925  A1       7/2009   Hu et al.
2021/0368603  A1 *   11/2021   Takahashi  .......... H05B 45/3575

* cited by examiner

LIGHT-EMITTING ELEMENT DRIVE SYSTEM AND LIGHT-EMITTING ELEMENT DRIVE DEVICE

CROSS-REFERENCE TO RELATED APPLICATIONS

This nonprovisional application is a continuation application of International Patent Application No. PCT/JP2023/016672 filed on Apr. 27, 2023, which claims priority Japanese Patent Application No. 2022-092745 filed on Jun. 8, 2022, the entire contents of which are hereby incorporated by reference.

TECHNICAL FIELD

The present disclosure relates to a light-emitting element drive system.

BACKGROUND ART

Conventionally, light emitting diodes (LEDs) having lower power consumption and long life are used in various applications. A conventional example of an LED drive device that drives the LED is disclosed in Patent Document 1.

The LED drive device of Patent Document 1 includes a DC/DC controller that controls an output stage to generate an output voltage from an input voltage and to supply the output voltage to the LED, and a constant current driver that generates an output current flowing in the LED, so as to drive a plurality of systems of LEDs. One system is constituted of a serial connection of LEDs, and the systems of LEDs are connected in parallel.

The DC/DC controller includes an error amplifier that compares a reference voltage with a lowest voltage among cathode voltages of the plurality of systems of LEDs, and a PWM comparator that compares an output of the error amplifier with a slope signal, so as to generate an internal pulse width modulation (PWM) signal.

The constant current driver is turned on and off on the basis of an external PWM signal input to a PWM terminal. Thus, PWM dimming control is performed. During ON period of the constant current driver, the error amplifier and the PWM comparator perform PWM drive of a switching element in the output stage with a switching pulse, so that the above lowest voltage among the cathode voltages agrees with the reference voltage. In this way, the output voltage (an anode voltage of the LED) is controlled to be a voltage obtained by adding the above reference voltage to a highest voltage among forward voltages of the plurality of systems of LEDs.

LIST OF CITATIONS

Patent Literature

Patent Document 1: JP-A-2013-21117

DESCRIPTION OF EMBODIMENTS

Hereinafter, an exemplary embodiment of the present disclosure is described with reference to the drawings.

1. Comparative Example

Here, before describing the embodiment of the present disclosure, a comparative example for comparison is described. From this description, a task of the embodiment of the present disclosure will be clarified.

Figure 6:
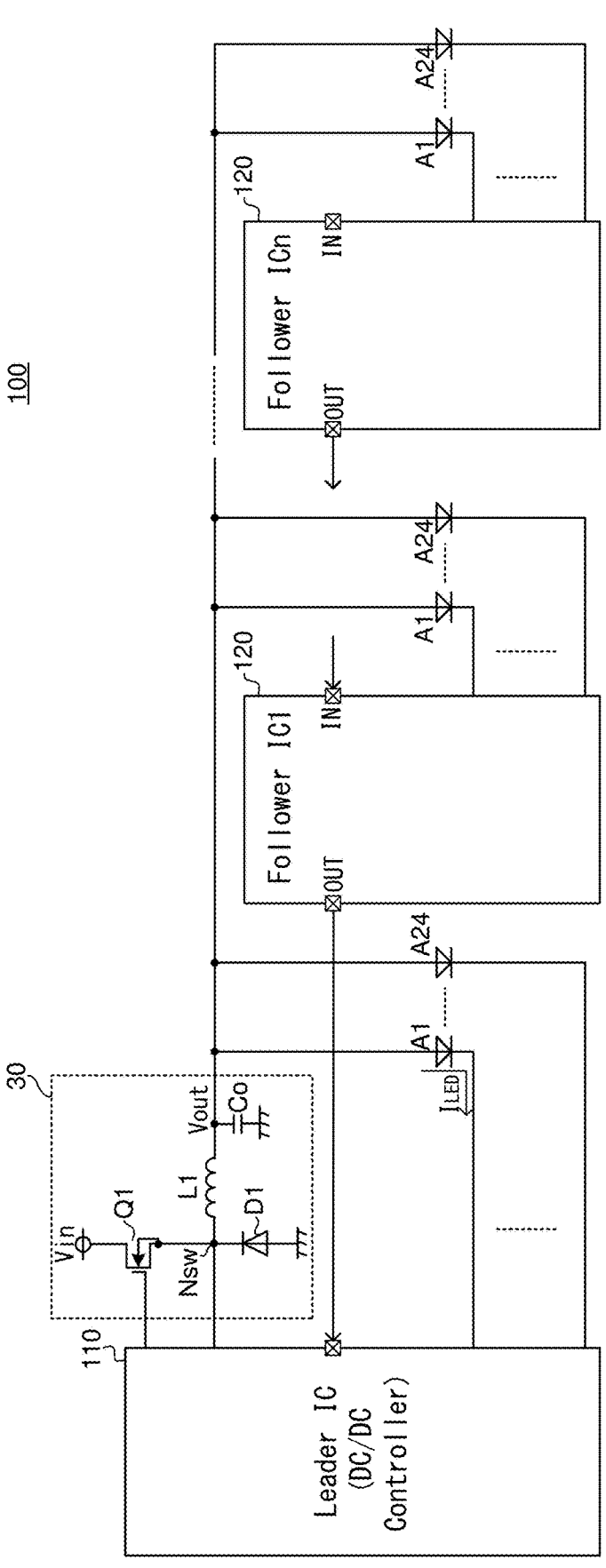
FIG. 6 is a diagram illustrating a structure of the LED drive system according to a comparative example.

FIG. 6 is a diagram illustrating a structure of an LED drive system 100 according to the comparative example. An LED is an example of a light-emitting element. In other words, the LED drive system is an example of a light-emitting element drive system. The LED drive system 100 illustrated in FIG. 6 includes a leader LED drive device 110 and a plurality of follower LED drive devices 120, and an output stage 30.

The leader LED drive device 110 includes a not-shown DC/DC controller, and controls the output stage 30 with the DC/DC controller. The leader LED drive device 110 is constituted of a semiconductor IC (hereinafter, referred to as a leader IC 110). The output stage 30 includes a switching element Q1, a diode D1, an inductor L1, and an output capacitor Co.

The switching element Q1 is constituted of an NMOS transistor, i.e., an N-channel type metal-oxide-semiconductor field-effect transistor (MOSFET). The drain of the switching element Q1 is connected to an application terminal of an input voltage Vin. The cathode of the diode D1 is connected to the source of the switching element Q1 at a node Nsw. The anode of the diode D1 is connected to a ground terminal. The node Nsw is connected to one end of the inductor L1. The other end of the inductor L1 is connected to one end of the output capacitor Co. The other end of the output capacitor Co is connected to the ground terminal.

When the switching element Q1 is switching-controlled by the above DC/DC controller, the input voltage Vin is converted into an output voltage Vout. The output voltage Vout is generated at the one end of the output capacitor Co.

The leader IC 110 is configured to be capable of driving a plurality of systems of LED arrays A1 to A24 by supplying an LED current $I_{LED}$ to each of the LED arrays A1 to A24. The LED array is constituted of LED elements connected in series. However, other than that, the LED array may be constituted of LED elements connected in parallel and series, or may be constituted of a single LED element. Here, the plurality of systems are 24 systems as an example, but this is not a limitation. The anodes of the LED arrays A1 to A24 to be driven by the leader IC 110 are connected to the application terminal of the output voltage Vout.

In the LED drive system 100, there are n follower LED drive devices 120 (n is an integer of 2 or more). The follower LED drive device 120 is constituted of a semiconductor IC (hereinafter, referred to as a follower IC 120). The follower IC 120 is configured to be capable of driving the plurality of systems of LED arrays A1 to A24 by supplying the LED current $I_{LED}$ to each of the LED arrays A1 to A24. Here, the plurality of systems are 24 systems as an example, but this is not a limitation. The anodes of the LED arrays A1 to A24 to be driven by the follower IC 120 are connected to the application terminal of the output voltage Vout. In other words, the application terminal of the output voltage Vout is connected to the anodes of (1+n)×24 systems of LED arrays.

The follower IC 120 is not equipped with the DC/DC controller. Therefore, the leader IC 110 equipped with the DC/DC controller controls the output stage 30 so as to generate the output voltage Vout, and the generated output voltage Vout can be supplied to the anodes of the (1+n)×24 systems of LED arrays.

In this way, in the LED drive system 100, (1+n)×24 systems of LED arrays can be driven. For instance, when animation display is performed, there is a case where the LED array to be driven by the leader IC 110 is not turned on, while the LED array to be driven by the follower IC 120 is turned on. In other words, there is a case where the leader IC 110 does not turn on the LED array to be driven by itself, while the follower IC 120 turns on the LED array, and in this case, it is necessary not to stop operation of the DC/DC controller.

For this reason, the LED drive system 100 is configured so that the follower IC 120 sends to the leader IC 110 an operation information signal related to driving of the LED array. Therefore, the follower IC 120 has an IN terminal and an OUT terminal. The IN terminal is an external terminal to input the operation information signal from the outside. The OUT terminal is an external terminal to output the operation information signal to the outside.

The side close to the leader IC 110 is referred to as a front stage side, while the side distant from the same is referred to as a rear stage side. The OUT terminal of the follower IC 120 on the rear stage side is connected to the IN terminal of the follower IC 120 on the front stage side, and hence the n follower ICs 120 are sequentially connected, and the OUT terminal of the follower IC 120 on the most front stage side is connected to the leader IC 110. In other words, the leader IC 110 and the follower ICs 120 are connected to form a daisy chain.

The follower IC 120 combines the operation information signal related to the LED array to be driven by itself with the operation information signal input to the IN terminal from the outside, so as to output the combined operation information signal from the OUT terminal to the outside. Note that the follower IC 120 on the most rear stage side outputs the operation information signal related to the LED array to be driven by itself from the OUT terminal. In this way, operation information signal related to the LED arrays (n×24 systems of LED arrays) to be driven by all the follower ICs 120 can be sent to the leader IC 110. In the leader IC 110, the DC/DC controller controls the output stage 30, on the basis of the input operation information signal.

Figure 7:
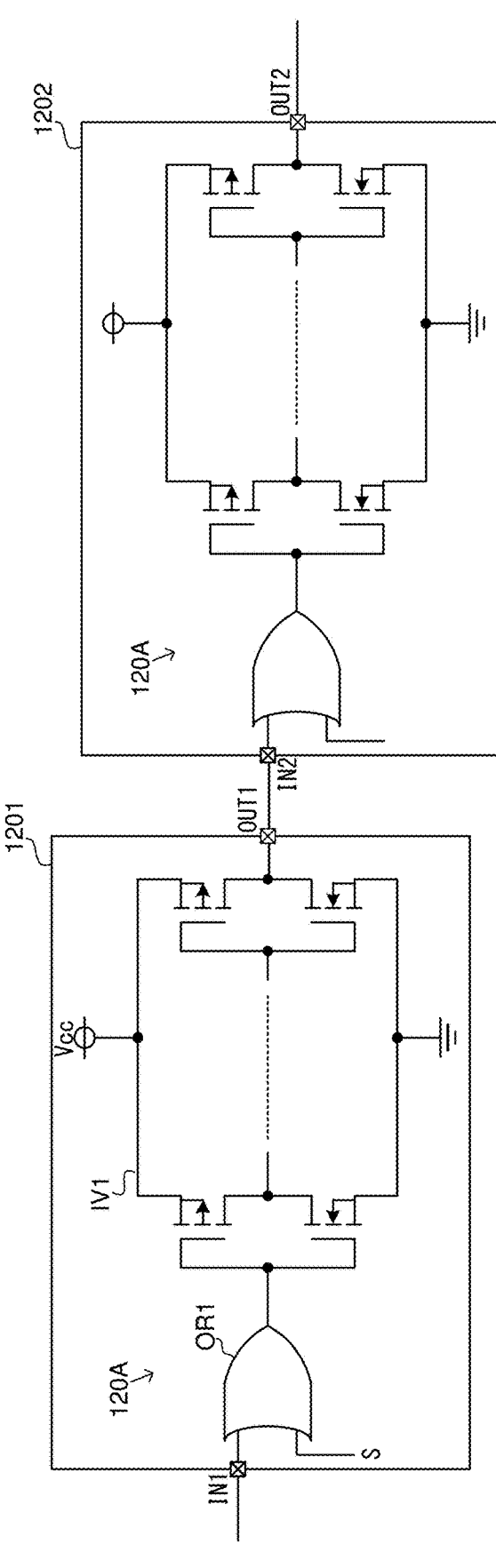
FIG. 7 is a diagram illustrating a structure of an input-output buffer of the follower IC according to the comparative example.

FIG. 7 is a diagram illustrating a structure of an input-output buffer 120A of the follower IC 120 according to the comparative example. FIG. 7 illustrates a connection relationship between the follower IC 120 on the rear stage side (denoted by 1201) and the follower IC 120 on the front stage side (denoted by 1202). The follower ICs 1201 and 1202 have the same structure of the input-output buffer 120A.

The input-output buffer 120A includes an OR circuit OR1 and an inverter stage IV1. A first input terminal of the OR circuit OR1 is connected to the IN terminal. A second input terminal of the OR circuit OR1 receives an internal signal S. The internal signal S is the operation information signal related to the LED array to be driven by the follower IC 120 itself. The OR circuit OR1 takes a logical sum of the operation information signal input to the IN terminal and the internal signal S. An output of the OR circuit OR1 is input to the inverter stage IV1.

The inverter stage IV1 is constituted of a plurality of inverters connected sequentially. One inverter includes a PMOS transistor (P-channel type MOSFET) and an NMOS transistor connected between a power supply voltage Vcc and the ground terminal. The signal that is output from the OR circuit OR1 and is input to the inverter stage IV1 is logically inverted by each inverter and is output from the OUT terminal. Note that the signal output from the OUT terminal has the same logical level as the output of the OR circuit OR1.

In FIG. 7, the operation information signal input to the IN terminal of the follower IC 1201 (denoted by IN1) is combined with the internal signal S by the input-output buffer 120A in the follower IC 1201, and is output from the OUT terminal (denoted by OUT1), so as to be input to the IN terminal of the follower IC 1202 (denoted by IN2) on the rear stage side. The operation information signal input to the IN terminal of the follower IC 1202 (denoted by IN2) is combined with the internal signal S by the input-output buffer 120A in the follower IC 1202, and is output from the OUT terminal (denoted by OUT2), so as to be sent to the rear stage side.

However, this comparative example has the following problem. First, as the ICs are connected in the daisy chain, the IN terminal and the OUT terminal are necessary to input and output the operation information signal, and when types of the operation information signals are increased, the number of terminals is further increased. Therefore, a package size of the IC cannot be reduced. In addition, a delay of the operation information signal occurs in the follower IC 120 distant from the leader IC 110, because the operation information signal is transmitted to the leader IC 110 via a number of the follower ICs 120 due to the daisy chain. As a result, a DC/DC operation reaction is delayed in the leader IC 110, so that a sufficient voltage is not applied as the anode voltage of the LED, and light intensity of the LED may be lowered for a moment.

Therefore, the embodiment of the present disclosure described below is implemented to solve the above problem.

2. Structure of LED Drive Device

Figure 1:
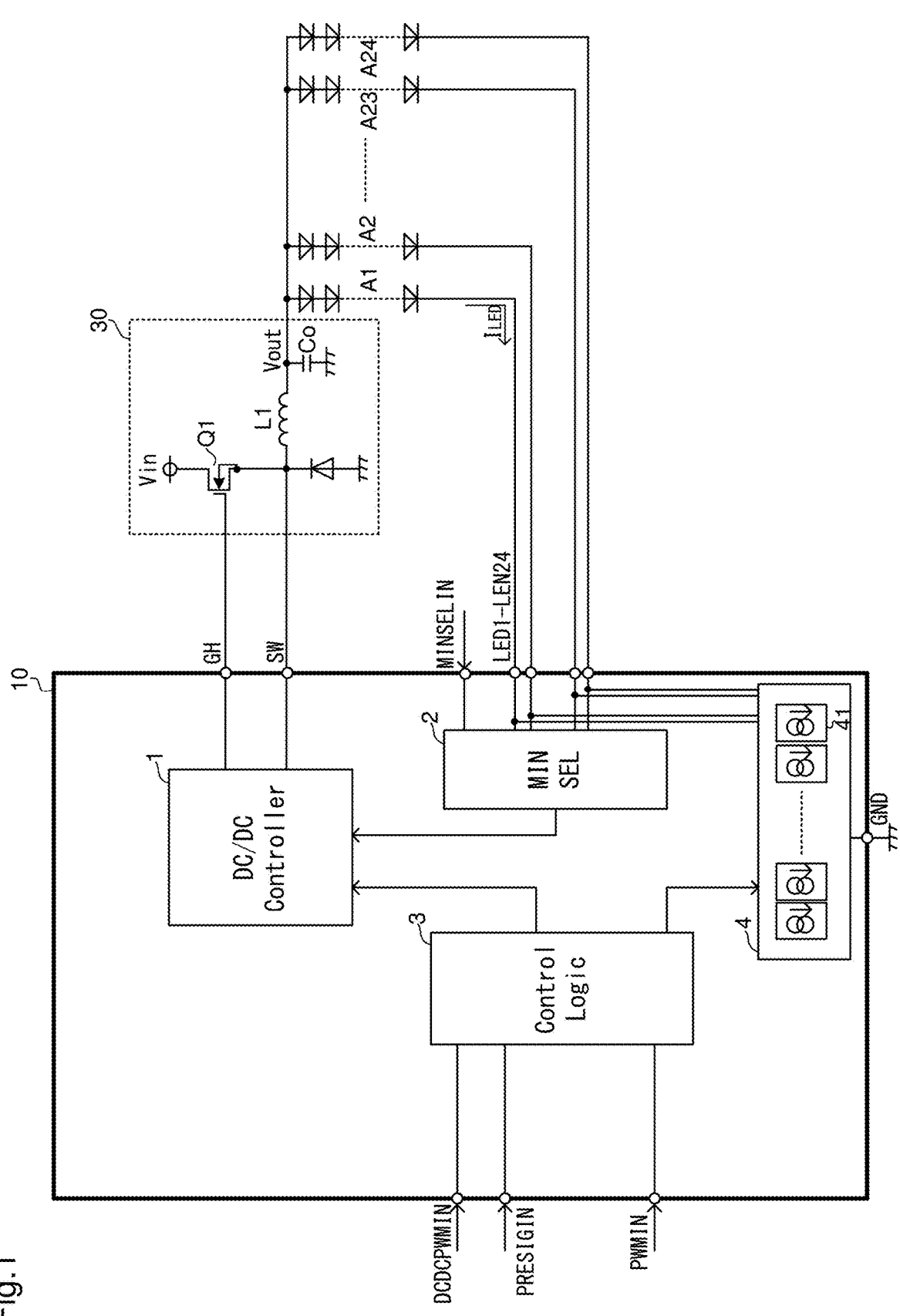
FIG. 1 is a diagram illustrating a structure of a leader LED drive device according to an embodiment of the present disclosure.

FIG. 1 is a diagram illustrating a structure of a leader LED drive device (hereinafter, referred to as a leader IC) 10 according to the embodiment of the present disclosure. The leader IC 10 is configured to be capable of driving the LED arrays A1 to A24.

The leader IC 10 is a semiconductor IC (a semiconductor device) in which a DC/DC controller 1, a selector 2, a control logic unit 3, and a current driver 4 are integrated. In addition, the leader IC 10 has external terminals to establish electric connection with the outside, which include a GH terminal, a SW terminal, a MINSELIN terminal, LED1 to LED24 terminals, a DCDCPWMIN terminal, a PRESIGIN terminal, and a PWMIN terminal.

The output stage 30 disposed outside the leader IC 10 has the same structure as that of the comparative example (FIG. 6). The DC/DC controller 1 switching-controls the switching element Q1 of the output stage 30, so as to convert the input voltage Vin into the output voltage Vout. The DC/DC controller 1 outputs a gate signal from the GH terminal to the gate of the switching element Q1 so as to drive the switching element Q1.

The LED arrays A1 to A24 have the same structure as those in the comparative example (FIG. 6). The application terminal of the output voltage Vout is connected to the anodes of the LED arrays A1 to A24. The cathodes of the LED arrays A1 to A24 are connected to the LED1 to LED24 terminals, respectively.

The selector 2 selects a lowest voltage among the cathode voltages applied to the LED1 to LED24 terminals and the voltage input to the MINSELIN terminal. The DC/DC controller 1 performs feedback control so that the voltage selected by the selector 2 becomes a desired value, so as to control the switching element Q1. The DC/DC controller 1 performs stability control of the output voltage Vout by PWM control, BANG-BANG control, or the like, for example.

The current driver 4 has constant current drivers 41 for 24 systems corresponding to the LED arrays A1 to A24, respectively. The constant current driver 41 supplies the LED current $I_{LED}$ to the corresponding LED array so as to drive the LED array.

The control logic unit 3 instructs the current driver 4 on the basis of a PWM dimming signal input to the PWMIN terminal. In this way, the PWM dimming control is performed in the constant current driver 41. The constant current driver 41 is turned on during ON period in one PWM dimming period, while the constant current driver 41 is turned off during OFF period in the same. In this way, light intensity of the LED array is adjusted in accordance with a duty ratio.

In addition, a first operation information signal is input to the DCDCPWMIN terminal, while a second operation information signal is input to the PRESIGIN terminal, which will be described later.

Figure 2:
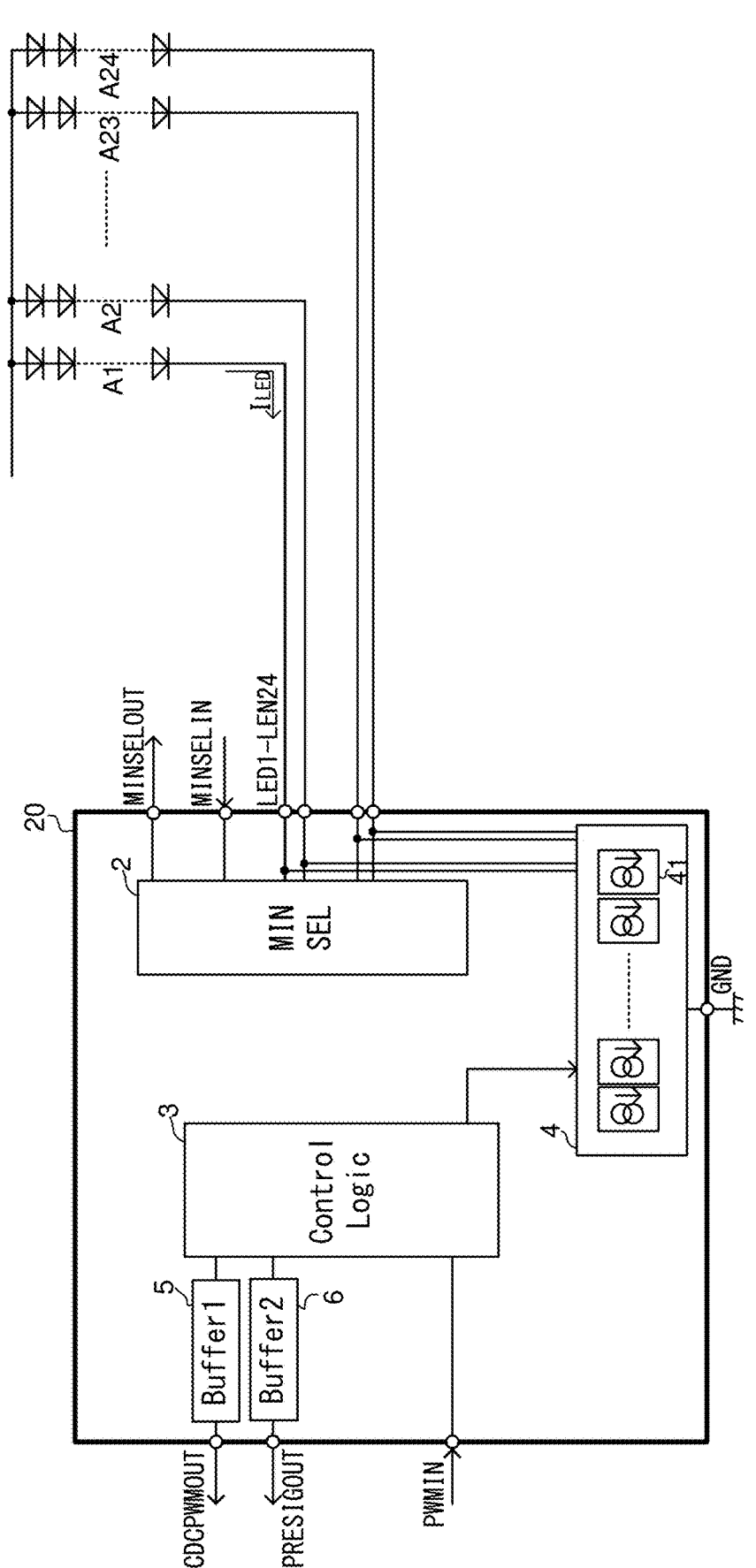
FIG. 2 is a diagram illustrating a structure of a follower LED drive device according to the embodiment of the present disclosure.

FIG. 2 is a diagram illustrating a structure of a follower LED drive device (hereinafter, referred to as a follower IC) 20 according to the embodiment of the present disclosure. The follower IC 20 is configured to be capable of driving the LED arrays A1 to A24. The follower IC 20 is used together with the leader IC 10.

Similarly to the leader IC 10, the follower IC 20 includes the selector 2, the control logic unit 3, and the current driver 4, but does not include a DC/DC controller unlike the leader IC 10. Therefore, the anodes of the LED arrays A1 to A24 to be driven by the follower IC 20 are connected to the application terminal of the output voltage Vout (FIG. 1).

The follower IC 20 has external terminals, which include the MINSELIN terminal, the PWMIN terminal, and the LED1 to LED24 terminals, as well as a MINSELOUT terminal, a DCDCPWMOUT terminal, and a PRESIGOUT terminal.

The selector 2 performs a selection operation similarly to the leader IC 10, and outputs a result of the selection from the MINSELOUT terminal.

Similarly to the leader IC 10, the current driver 4 performs PWM dimming on the basis of the PWM dimming signal input to the PWMIN terminal.

The follower IC 20 further includes a first buffer 5 and a second buffer 6. The first buffer 5 outputs the first operation information signal from the DCDCPWMOUT terminal. The second buffer 6 outputs the second operation information signal from the PRESIGOUT terminal. The first and second operation information signals are of information related to driving of the LED arrays A1 to A24 to be driven by the follower IC 20, and details of them will be described later.

3. LED Drive System

Figure 3:
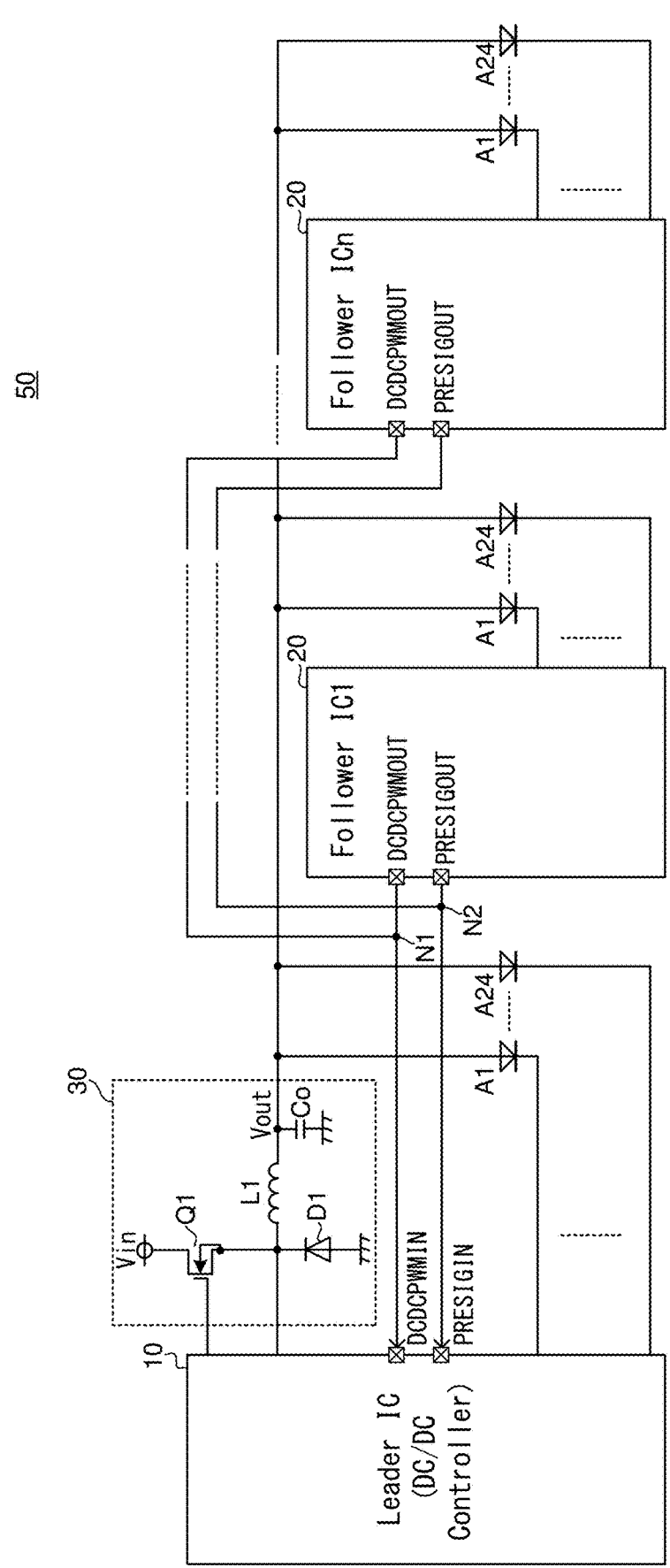
FIG. 3 is a diagram illustrating a structure of an LED drive system according to the embodiment of the present disclosure.

FIG. 3 is a diagram illustrating a structure of an LED drive system 50 according to the embodiment of the present disclosure. The LED drive system 50 illustrated in FIG. 3 includes the leader IC 10, a plurality of the follower ICs 20 (n follower ICs 20), and the output stage 30.

Similarly to the comparative example, in the LED drive system 50, the anodes of the LED arrays A1 to A24 to be driven by the leader IC 10 and the LED arrays A1 to A24 to be driven by each follower IC 20 are connected to the application terminal of the output voltage Vout.

As illustrated in FIG. 3, the DCDCPWMOUT terminals of the n follower ICs 20 are connected to a first node N1. Similarly, the PRESIGOUT terminals of the n follower ICs 20 are connected to a second node N2. The first node N1 is connected to the DCDCPWMIN terminal of the leader IC 10. The second node N2 is connected to the PRESIGIN terminal of the leader IC 10.

Thus, in this embodiment, the leader IC 10 and the n follower ICs 20 are connected in a star connection. Due to the star connection, the follower IC 20 does not need the IN terminal to input the operation information signal, and the number of external terminals can be reduced. Therefore, a package size of the follower IC 20 can be reduced. In addition, due to the star connection, it is possible to suppress transmission delay of the operation information signal from each follower IC 20 to the leader IC 10.

4. Buffer

Figure 4A:
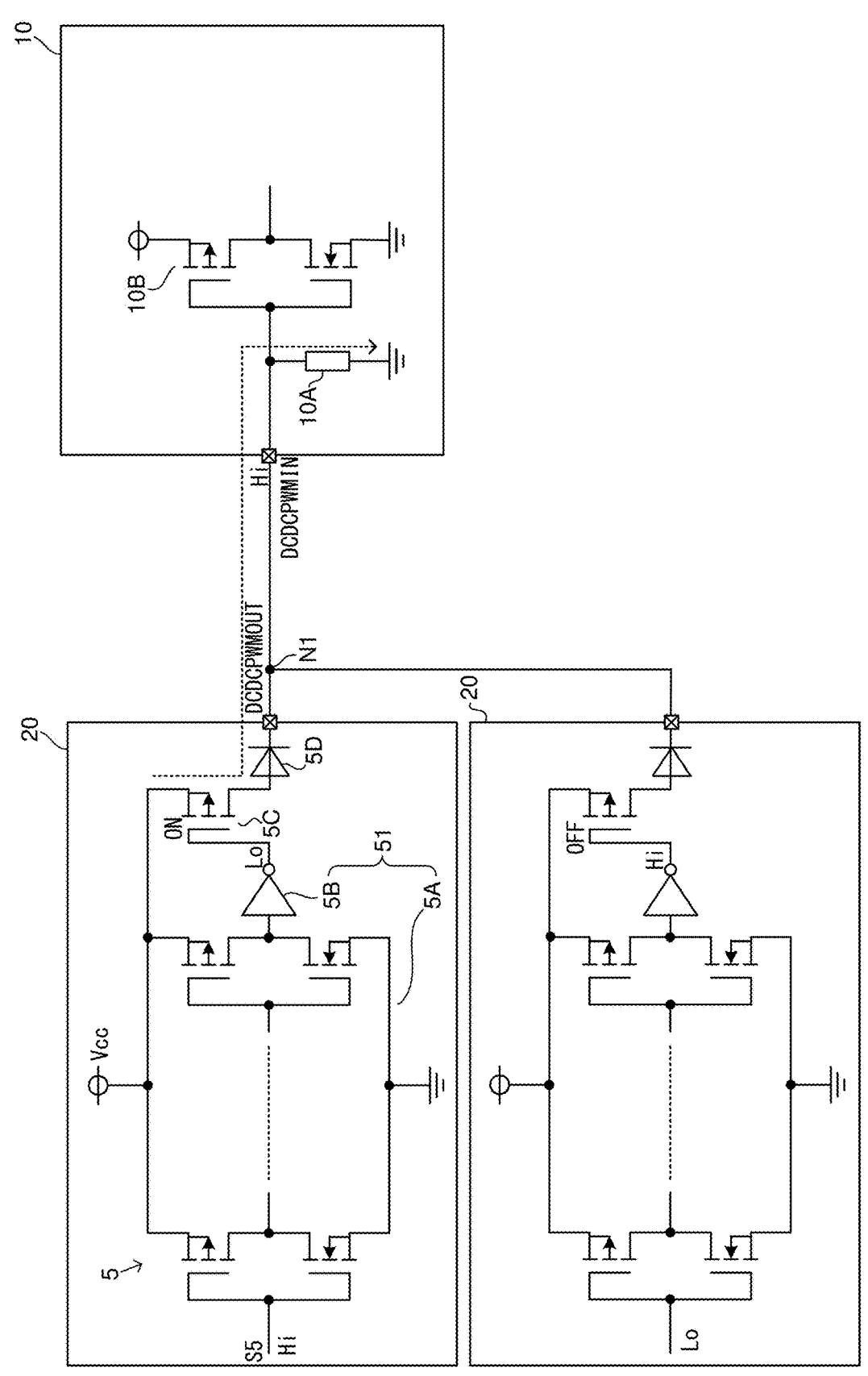
FIG. 4A is a diagram illustrating a structure example of a first buffer in a follower IC.

FIG. 4A is a diagram illustrating a structure example of the first buffer 5 in the follower IC 20. FIG. 4A illustrates only two typical follower ICs 20 out of the n follower ICs 20, and illustrates a connection relationship between the first buffer 5 and an input stage of the leader IC 10. Note that the second buffer 6 also has the same structure as illustrated in FIG. 4A, and the first buffer 5 is typically described here.

The first buffer 5 includes an inverter stage 51, a PMOS transistor 5C, and a diode 5D.

The inverter stage 51 includes an inverter stage 5A constituted of a plurality of inverters connected sequentially, and an output inverter 5B connected to a rear stage of the inverter stage 5A. The internal signal S5 is input to the inverter stage 5A. The internal signal S5 is the first operation information signal related to driving of the LED arrays A1 to A24, which is to be driven by the follower IC 20.

The gate of the PMOS transistor 5C is connected to an output terminal of the output inverter 5B. The source of the PMOS transistor 5C is connected to an application terminal of the power supply voltage Vcc. The drain of the PMOS transistor 5C is connected to the anode of the diode 5D. The cathode of the diode 5D is connected to the DCDCPWMOUT terminal.

As described above, the DCDCPWMOUT terminals of the plurality of the follower ICs 20 are connected to the first node N1. The first node N1 is connected to the DCDCPWMIN terminal of the leader IC 10. The input stage of the leader IC 10 includes a pull-down resistor 10A and an inverter 10B. The DCDCPWMIN terminal is connected to one end of the pull-down resistor 10A. The other end of the pull-down resistor 10A is connected to the ground terminal. The DCDCPWMIN terminal is connected to an input terminal of the inverter 10B.

Thus, in this embodiment, the first buffer 5 has a drain output structure of the PMOS transistor 5C. In this way, if the internal signal S5 is at high level, the output of the inverter stage 5A is at high level, the output of the output inverter 5B is at low level, the PMOS transistor 5C is turned on, and a high level signal is output from the drain of the PMOS transistor 5C. In contrast, if the internal signal S5 is at low level, the output of the inverter stage 5A is at low level, the output of the inverter stage 5B is at high level, the PMOS transistor 5C is turned off, and a low level signal is output from the drain of the PMOS transistor 5C.

For instance, as the state illustrated in FIG. 4A, if the internal signal S5 is at high level so that the drain output of the PMOS transistor 5C is at high level in some of the n follower ICs 20, even if the drain output of the PMOS transistor 5C is at low level in the other follower ICs 20 (the internal signal S5 is at low level), a backflow of current is prevented by the diode 5D, and insufficient signal input to the DCDCPWMIN terminal is suppressed. In this case, as illustrated by a broken line arrow in FIG. 4A, current flows in the pull-down resistor 10A via the PMOS transistor 5C that is turned on, and a signal at the DCDCPWMIN terminal (the input terminal of the inverter 10B) is at high level.

Figure 4B:
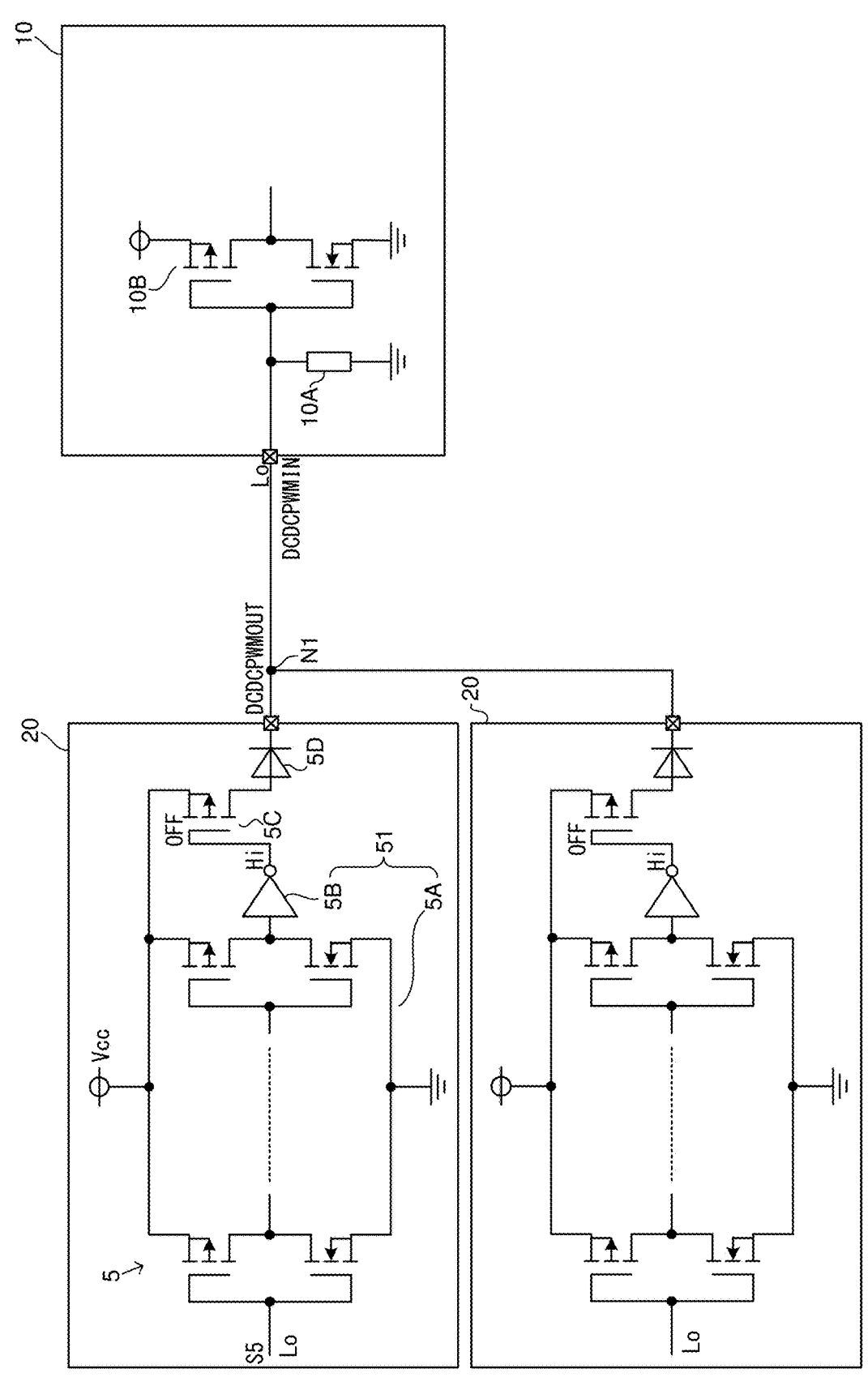
FIG. 4B is a diagram illustrating a state of the first buffer, which is other than that of FIG. 4A.

Note that as illustrated in FIG. 4B, if the internal signal S5 is at low level in every follower IC 20 so that the drain output of the PMOS transistor 5C is at low level, the signal at the DCDCPWMIN terminal (the input terminal of the inverter 10B) is at low level.

Figure 8:
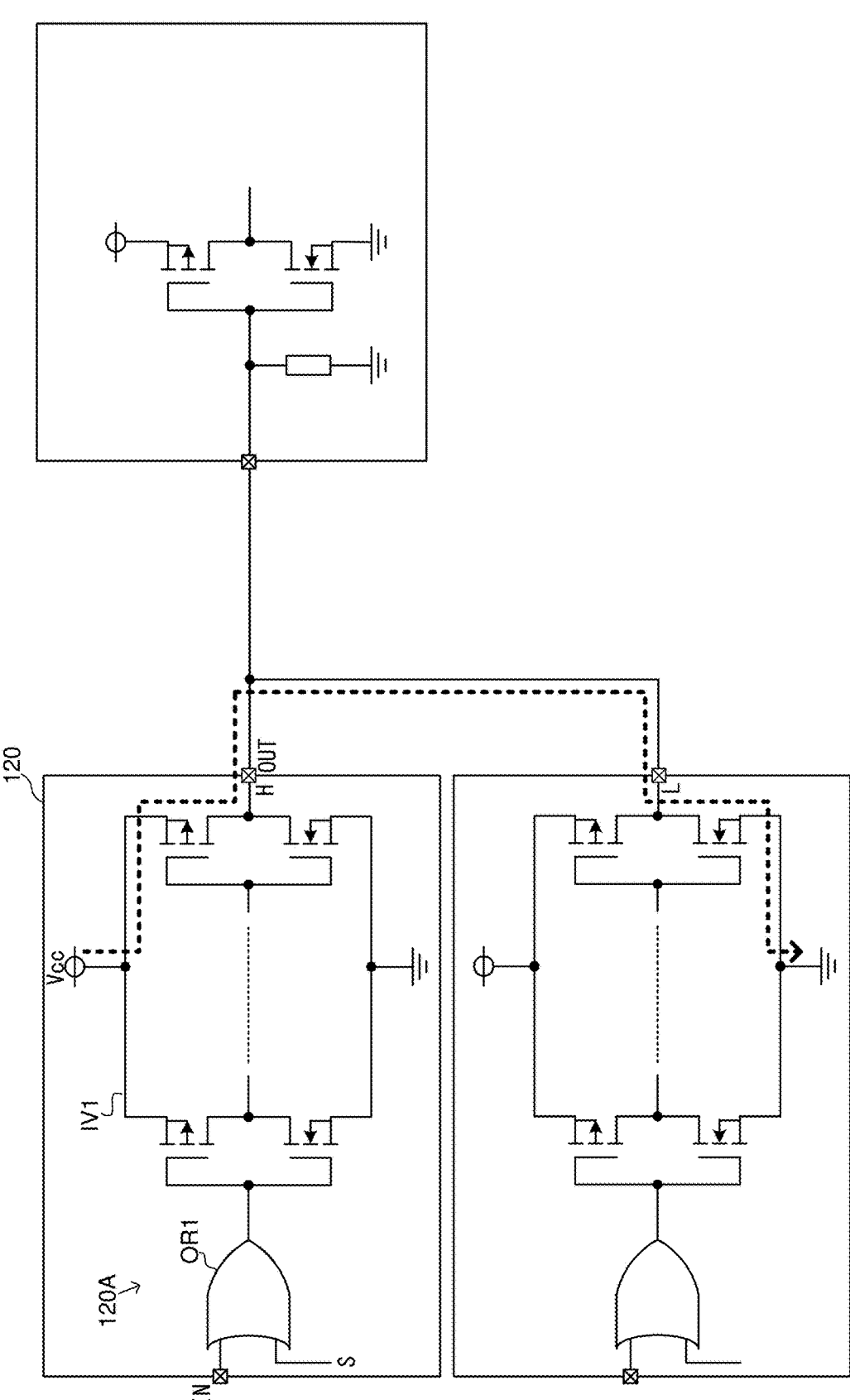
FIG. 8 is a diagram illustrating a structure in which the input-output buffers of the follower ICs according to the comparative example are temporarily connected in a star connection.

Here, FIG. 8 illustrates a structure in which the input-output buffers 120A of the follower ICs 120, according to the comparative example described above, are temporarily connected in a star connection. In this case, if a high level signal is output from one inverter stage IV1 while a low level signal is output from the other inverter stage IV1, as a path illustrated by a broken line arrow in FIG. 8, a large current flows from the application terminal of the power supply voltage Vcc to the ground terminal, via the PMOS transistor of the inverter on the final stage of one inverter stage IV1, one OUT terminal, the other OUT terminal, and the NMOS transistor of the inverter on the final stage of the other inverter stage IV1. In this way, the input signal to the leader IC becomes insufficient. Therefore, it is difficult to realize a star connection of the follower ICs 120 in the structure according to the comparative example.

Figure 4C:
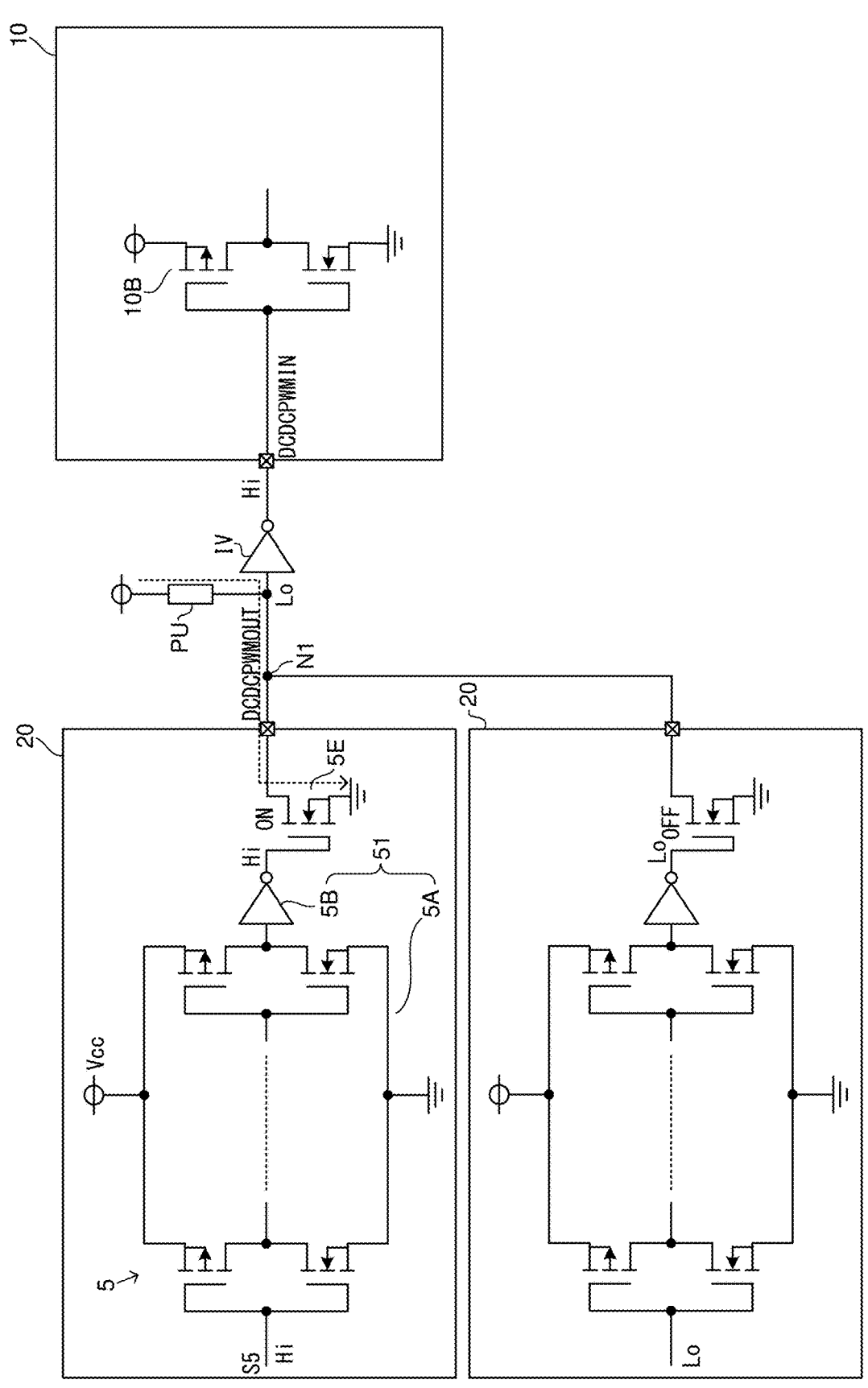
FIG. 4C is a diagram illustrating a variation of the first buffer.

FIG. 4C is a diagram illustrating a variation of the first buffer 5. In this variation, an NMOS transistor 5E is disposed instead of the PMOS transistor 5C in the first buffer 5. The source of the NMOS transistor 5E is connected to the ground terminal. The drain of the NMOS transistor 5E is connected to the DCDCPWMOUT terminal. In this variation, a pull-up resistor PU is disposed, whose one end is connected to the application terminal of the power supply voltage, and the DCDCPWMOUT terminal is connected to the other end of the pull-up resistor PU. In addition, an inverter IV is disposed between the node N1 and the DCDCPWMIN terminal. Note that in this variation, a pull-down resistor is not disposed on the front stage of the inverter 10B.

For instance, as the state illustrated in FIG. 4C, if the internal signal S5 is at high level in some of the n follower ICs 20, the output of the inverter stage 5A is at low level, the output of the inverter stage 5A is at high level, and the NMOS transistor 5E is turned on. In the other follower ICs 20, as the internal signal S5 is at low level, the output of the inverter stage 5A is at high level, the output of the inverter stage 5B is at low level, and the NMOS transistor 5E is turned off. In this case, as illustrated by a broken line arrow in FIG. 4C, current flows in the NMOS transistor 5E that is turned on, via the pull-up resistor PU, the signal at the input terminal of the inverter IV is at low level, and the signal that is output from the inverter IV and is input to the DCDCPWMIN terminal is at high level.

Figure 4D:
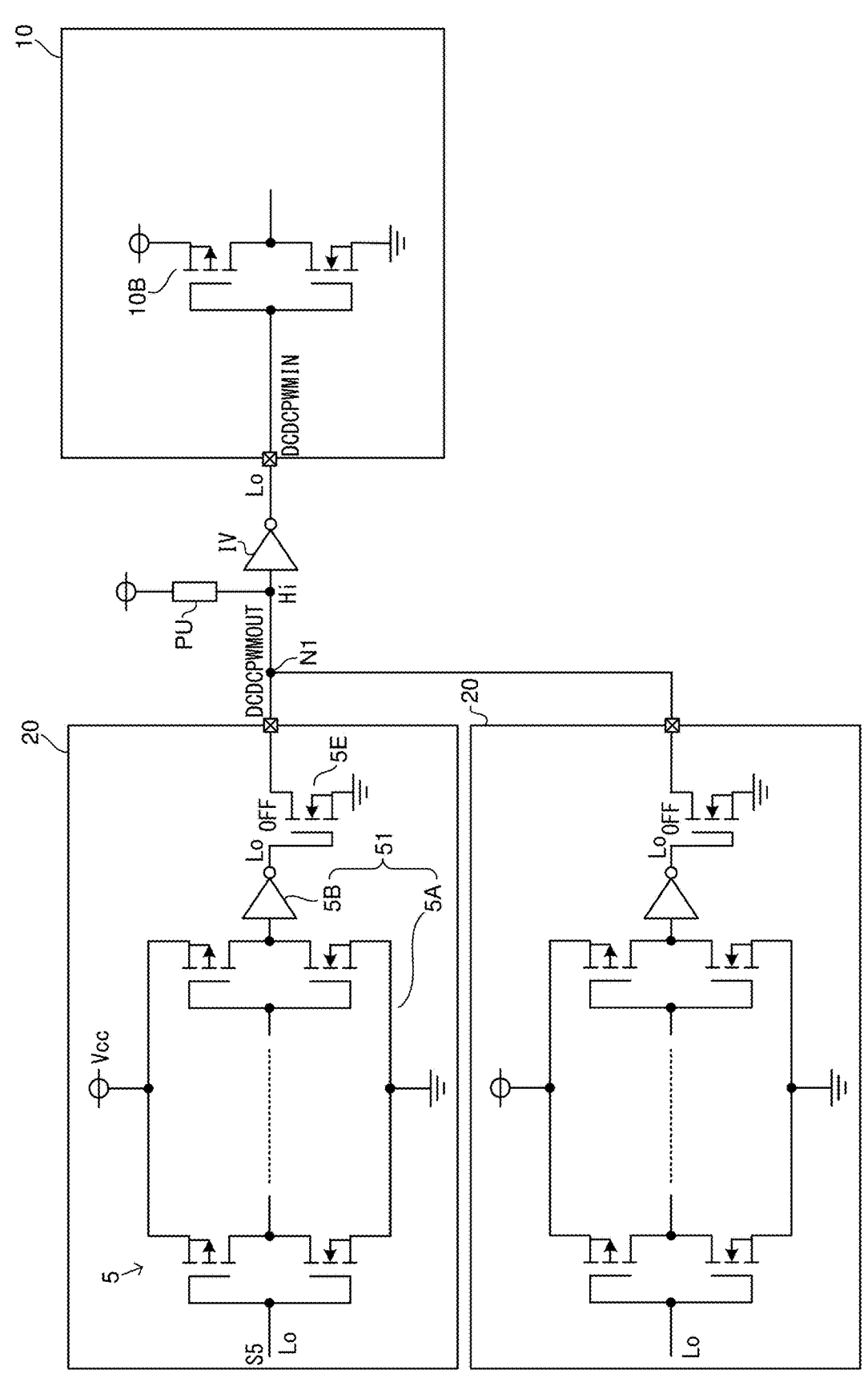
FIG. 4D is a diagram illustrating a state of the first buffer, which is other than that of FIG. 4C.

Note that as illustrated in FIG. 4D, if the internal signal S5 is at low level in every follower IC 20, all the NMOS transistors 5E are turned off, the signal at the input terminal of the inverter IV is at high level, and the signal that is output from the inverter IV and is input to the DCDCPWMIN terminal is at low level.

In this way, the embodiment using the PMOS transistor 5C in the first buffer 5 (FIG. 4A) has a merit that the inverter IV is not necessary.

5. Operation Information Signal

Here, the first and second operation information signals as examples of the operation information signal are described. As described above, the first operation information signal is output from the first buffer 5, while the second operation information signal is output from the second buffer 6.

Figure 5:
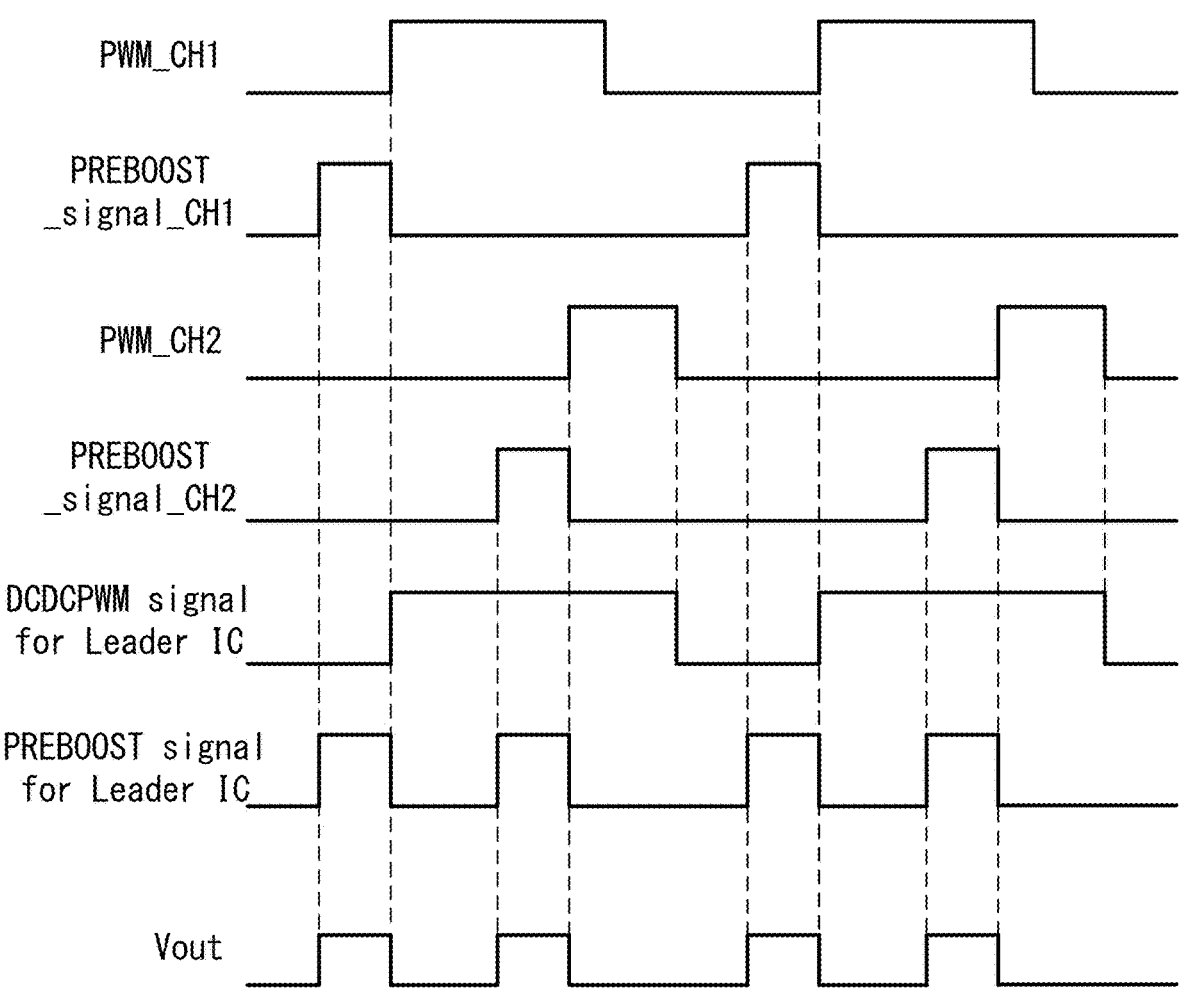
FIG. 5 is a timing chart illustrating an example related to generation of first and second operation information signals in the follower IC.

FIG. 5 is a timing chart illustrating an example related to generation of the first and second operation information signals in the follower IC 20. FIG. 5 illustrates waveform examples of the PWM dimming signal for the LED array A1 (a channel CH1), a preboost signal for the channel CH1, the PWM dimming signal for the LED array A2 (a channel CH2), the preboost signal for the channel CH2, the first operation information signal (the DCDCPWM signal), the second operation information signal (the preboost signal), and the output voltage Vout, in order from top to bottom. Note that there are only CH1 and CH2 as the systems of LED arrays in FIG. 5 for convenience sake, but in reality, there are signals of 24 systems.

The PWM dimming signal indicates that the constant current driver 41 is turned on when it is at high level, while it indicates that the constant current driver 41 is turned off when it is at low level. In other words, the LED array is turned on when it is at high level, while the LED array is turned off when it is at low level.

Inside the follower IC 20, the PWM dimming signals of the systems of LED arrays are combined so as to generate the first operation information signal. More specifically, if at least one of the PWM dimming signals of the systems is at high level, the first operation information signal is made high level, and if all the PWM dimming signals of the systems are at low level, the first operation information signal is made low level. The generated first operation information signal is output as the internal signal S5 (FIG. 4A or the like) from the DCDCPWMOUT terminal via the first buffer 5.

Here, in the LED drive system 50 illustrated in FIG. 5, in order from the follower IC 20 on the most rear stage side, the MINSELOUT terminal is connected to the MINSELIN terminal of the IC on the front stage side, and hence the n follower ICs 20 are connected. Further, the MINSELOUT terminal of the follower IC 20 on the most front stage side is connected to the MINSELIN terminal of the leader IC 10. In this way, the DC/DC controller 1 of the leader IC 10 performs the feedback control so that the lowest voltage among the cathode voltages of the (1+n)×24 LED arrays becomes a desired value.

The preboost function is a function of performing the control to raise the output voltage Vout, so as to be predetermined fixed voltage value higher than the output voltage Vout controlled by the feedback control, by the DC/DC controller 1, just before switching the PWM dimming from off to on.

Inside the follower IC 20, for each system of the LED arrays, the preboost signal is made high level for a predetermined period just before the PWM dimming signal rises. Inside the follower IC 20, the preboost signals of the systems of LED arrays are combined so as to generate the second operation information signal. More specifically, if at least one of the preboost signals of the systems is at high level, the second operation information signal is made high level, and if all the preboost signals of the systems are at low level, the second operation information signal is made low level. The generated second operation information signal is output as an internal signal S6 (corresponding to the internal signal S5 of the first buffer 5) from the PRESIGOUT terminal via the second buffer 6.

If the second operation information signal input to the PRESIGIN terminal of the leader IC 10 is at high level, the DC/DC controller 1 controls the output voltage Vout to be a fixed voltage value, and the preboost is performed. If the second operation information signal input to the PRESIGIN terminal is at low level, and if the first operation information signal input to the DCDCPWMIN terminal of the leader IC 10 is at high level, the DC/DC controller 1 performs the feedback control. If the second operation information signal input to the PRESIGIN terminal is at low level, and if the first operation information signal input to the DCDCPWMIN terminal is at low level, the DC/DC controller 1 stops its operation, and generation of the output voltage Vout is stopped.

6. Others

Note that, other than the above embodiment, various technical features disclosed in this specification can be variously modified within the scope of the technical invention without deviating from the spirit thereof. In other words, the above embodiment is an example in every aspect and should not be interpreted as a limitation. The scope of the present invention is not limited to the above embodiment but should be understood to include all modifications within meaning and scope equivalent to the claims.

7. Additional Remarks

As described above, a light-emitting element drive system (50) according to one aspect of the present disclosure includes:
  a leader light-emitting element drive device (10) configured to be capable of driving light-emitting elements (A1 to A24), and to include a DC/DC controller (1) configured to be capable of controlling an output stage (30) capable of outputting an output voltage (Vout); and a plurality of follower light-emitting element drive devices (20) configured to be capable of driving the light-emitting elements applied with the output voltage, in which
  the follower light-emitting element drive device includes at least one signal output terminal (DCDCPWMOUT terminal, PRESIGOUT terminal) capable of outputting an operation information signal related to driving of the light-emitting elements, a plurality of the signal output terminals are connected to the same node (N1, N2), and
  the same node is connected to a signal input terminal (DCDCPWMIN terminal, PRESIGIN terminal) of the leader light-emitting element drive device (first structure).

Further, in the above first structure, it may be possible to configure the follower light-emitting element drive device (20) to further include a buffer (5) including an inverter stage (51) configured to be capable of receiving the operation information signal, and
  a MOS transistor (5C) having a gate connected to an output terminal of the inverter stage, and a drain connected to the signal output terminal (second structure).

In addition, in the above second structure, it may be possible to configure so that the MOS transistor is a PMOS transistor (5C) (third structure).

In addition, in the above third structure, it may be possible to configure the buffer (5) to further include a diode (5D) having an anode connected to a drain of the PMOS transistor (5C), and a cathode connected to the signal output terminal (fourth structure).

In addition, in any one of the above first to fourth structures, it may be possible to configure so that the operation information signal includes a signal generated on the basis of a PWM dimming signal for performing PWM dimming of the light-emitting elements (A1 to A24), which is to be driven by the follower light-emitting element drive device (20) (fifth structure).

In addition, in the above fifth structure, it may be possible to configure so that the operation information signal includes a signal generated on the basis of a preboost signal for controlling the output voltage to be a voltage value higher than the output voltage (Vout) generated by feedback control by the DC/DC controller (1), and that the preboost signal is generated for a predetermined period just before timing at which the PWM dimming signal is switched from a dimming off state to a dimming on state (sixth structure).

In addition, a light-emitting element drive device (20) according to one aspect of the present disclosure includes a buffer (5) including
  a signal output terminal (DCDCPWMOUT terminal),
  an inverter stage (51), and
  a MOS transistor (5C) having a gate connected to an output terminal of the inverter stage, and a drain connected to the signal output terminal, in which the inverter stage is capable of receiving an operation information signal (S5) related to driving of the light-emitting elements (A1 to A24) to be driven (seventh structure).

In addition, in the above seventh structure, it may be possible to configure so that the MOS transistor is a PMOS transistor (5C) (eighth structure).

In addition, in the above eighth structure, it may be possible to configure the buffer (5) to further include a diode (5D) having an anode connected to a drain of the PMOS transistor (5C), and a cathode connected to the signal output terminal (DCDCPWMOUT terminal) (ninth structure).

INDUSTRIAL APPLICABILITY

The present disclosure can be applied to driving of LEDs, for example.

LIST OF REFERENCE SIGNS

1 DC/DC controller
2 selector
3 control logic unit
4 current driver
5 first buffer
5A inverter stage
5B output inverter
5C PMOS transistor
5D diode
5E NMOS transistor
6 second buffer
10 leader LED drive device
20 follower LED drive device
10A pull-down resistor
10B inverter
30 output stage
41 constant current driver
50 LED drive system
51 inverter stage
100 LED drive system
110 leader LED drive device
120 follower LED drive device
120A input-output buffer
A1 to A24 LED array
Co output capacitor
D1 diode
IV inverter
IV1 inverter stage
L1 inductor
N1 first node
N2 second node
Nsw node
PU pull-up resistor
Q1 switching element
OR1 OR circuit

The invention claimed is:

1. A light-emitting element drive system comprising:
a leader light-emitting element drive device configured to be capable of driving light-emitting elements, and to include a DC/DC controller configured to be capable of controlling an output stage capable of outputting an output voltage; and
a plurality of follower light-emitting element drive devices configured to be capable of driving the light-emitting elements applied with the output voltage, wherein
the follower light-emitting element drive device includes at least one signal output terminal capable of outputting an operation information signal related to driving of the light-emitting elements,
a plurality of signal output terminals connected to a same node,
the same node is connected to a signal input terminal of the leader light-emitting element drive device,
the operation information signal is a binary signal that indicates whether the light-emitting elements are on or off, and
the leader light-emitting element drive device is configured to control the DC/DC controller to maintain output of the output voltage based on the operation information signal indicating that the light-emitting elements are on even when the light-emitting elements that the leader light-emitting element drive device itself drives are all off.

2. The light-emitting element drive system according to claim 1, wherein the follower light-emitting element drive device further include a buffer including
an inverter stage configured to be capable of receiving the operation information signal, and
a MOS transistor having a gate connected to an output terminal of the inverter stage, and a drain connected to the signal output terminal.

3. The light-emitting element drive system according to claim 2, wherein the MOS transistor is a PMOS transistor.

4. The light-emitting element drive system according to claim 3, wherein the buffer further includes a diode having an anode connected to a drain of the PMOS transistor, and a cathode connected to the signal output terminal.

5. The light-emitting element drive system according to claim 1, wherein the operation information signal includes a signal generated on the basis of a PWM dimming signal for performing PWM dimming of the light-emitting elements, which is to be driven by the follower light-emitting element drive device.

6. The light-emitting element drive system according to claim 5, wherein the operation information signal includes a signal generated on the basis of a preboost signal for controlling the output voltage to be a voltage value higher than the output voltage generated by feedback control by the DC/DC controller, and
the preboost signal is generated for a predetermined period just before timing at which the PWM dimming signal is switched from a dimming off state to a dimming on state.

7. A light-emitting element drive system comprising:
a leader light-emitting element drive device configured to be capable of driving light-emitting elements, and to include a DC/DC controller configured to be capable of controlling an output stage capable of outputting an output voltage; and
a plurality of follower light-emitting element drive devices configured to be capable of driving the light-emitting elements applied with the output voltage, wherein
the follower light-emitting element drive device includes at least one signal output terminal capable of outputting an operation information signal related to driving of the light-emitting elements,
a plurality of the signal output terminals are connected to the same node, and
the same node is connected to a signal input terminal of the leader light-emitting element drive device,
the follower light-emitting element drive device further include a buffer including an inverter stage configured to be capable of receiving the operation information signal, and
a MOS transistor having a gate connected to an output terminal of the inverter stage, and a drain connected to the signal output terminal.

8. A light-emitting element drive system comprising:
a leader light-emitting element drive device configured to be capable of driving light-emitting elements, and to include a DC/DC controller configured to be capable of controlling an output stage capable of outputting an output voltage; and a plurality of follower light-emitting element drive devices configured to be capable of driving the light-emitting elements applied with the output voltage, wherein the follower light-emitting element drive device includes at least one signal output terminal capable of outputting an operation information signal related to driving of the light-emitting elements, a plurality of the signal output terminals are connected to the same node, and the same node is connected to a signal input terminal of the leader light-emitting element drive device, the operation information signal includes a signal generated on the basis of a PWM dimming signal for performing PWM dimming of the light-emitting elements, which is to be driven by the follower light-emitting element drive device, the operation information signal includes a signal generated on the basis of a preboost signal for controlling the output voltage to be a voltage value higher than the output voltage generated by feedback control by the DC/DC controller, and the preboost signal is generated for a predetermined period just before timing at which the PWM dimming signal is switched from a dimming off state to a dimming on state.

\* \* \* \* \*